United States Patent [19]

Draxelmayr

[11] Patent Number: 4,972,107
[45] Date of Patent: Nov. 20, 1990

[54] SENSOR CIRCUIT CONFIGURATION

[75] Inventor: Dieter Draxelmayr, Villach, Austria

[73] Assignee: Siemens Aktiengesellschaft, Munich, Fed. Rep. of Germany

[21] Appl. No.: 415,197

[22] Filed: Sep. 29, 1989

[30] Foreign Application Priority Data

Sep. 30, 1988 [EP] European Pat. Off. ........ 88116231.7

[51] Int. Cl.⁵ ............................................ H03K 17/693
[52] U.S. Cl. .................................... 307/530; 307/243;
307/290; 307/360; 307/480; 328/63
[58] Field of Search ............... 307/465, 480, 517, 530,
307/593–594, 360, 243, 264, 274, 290; 328/61, 63

[56] References Cited

U.S. PATENT DOCUMENTS

| 4,423,340 | 12/1983 | Spinks | 307/360 X |
|---|---|---|---|
| 4,529,892 | 7/1985 | Reilly et al. | 307/290 X |
| 4,675,550 | 6/1987 | Hafner | 307/290 X |
| 4,682,047 | 7/1987 | Van Sichart | 307/360 X |
| 4,722,070 | 1/1988 | Dye | 364/900 |
| 4,745,573 | 5/1988 | Lebel | 307/465 X |
| 4,761,567 | 8/1988 | Walters, Jr. et al. | 328/63 X |
| 4,903,223 | 2/1990 | Norman et al. | 307/465 X |
| 4,912,339 | 3/1990 | Béchade et al. | 307/243 |
| 4,916,333 | 4/1990 | Kowalski | 307/530 X |

OTHER PUBLICATIONS

Patent Abstracts of Japan, vol. 8, No. 33 (P-254), 1470, Feb. 14, 1984, JP-A-58-186817 (Nippon Denso).

*Primary Examiner*—David Hudspeth
*Attorney, Agent, or Firm*—Herbert L. Lerner; Laurence A. Greenberg

[57] ABSTRACT

A sensor circuit configuration includes a digital signal source and a further signal source having a function-determining element. A controllable current source configuration has an output. A control terminal selectively connects the controllable current source configuration to the digital signal source and to the function-determining element. A multiplexer has an address input controlled by the output of the controllable current source configuration and data inputs connected to the signal sources.

11 Claims, 1 Drawing Sheet

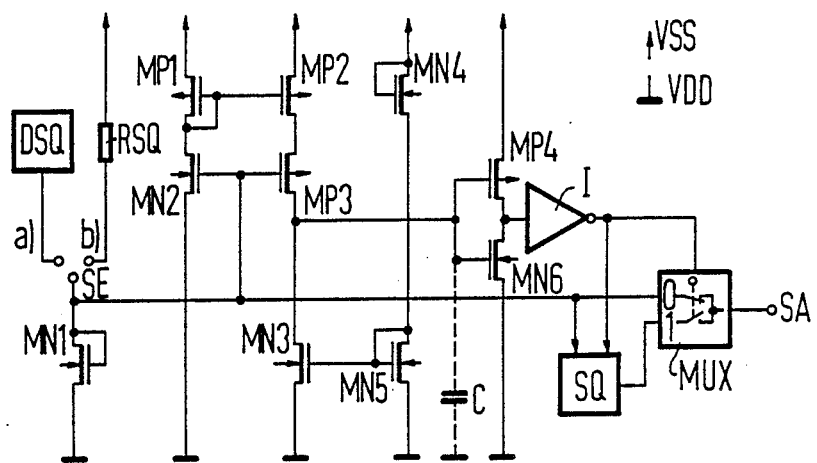

SENSOR CIRCUIT CONFIGURATION

The invention relates to a sensor circuit configuration for a digital and a further signal source.

For many circuits, there is a need for being able to alternatively use a digital signal source and a further, preferably second digital signal source. For example, many integrated circuits are provided with an external terminal to which either an external clock generator or a frequency-determining component such as a resistor or capacitor for a jointly integrated internal clock generator, is to be connected. In any case, a circuit configuration is necessary within the integrated circuit that enables the selective operation of the internal or external clock generator.

The known integrated circuit AD 7582 of Analog Devices has one or more capacitors as the frequency-determining component for the internal clock generator. In the case of the capacitors, a (dis-) charge current source is in turn typically necessary. When an external clock generator is connected to the external terminal, the clock generator typically pulls the internal clock generator with it. In other words, the external generator must jointly drive the jointly running (dis-) charge current for the internal generator operation. This entails losses. On the other hand, the capacitor cannot be selected to be arbitrarily small, because it must be larger than the parasitic capacitance which is present from the connection paths, bonds, housing, substrate and others elements. Thus for operation, relatively high currents are necessary if relatively high clock frequencies are to be attained, because low currents lead to small amplitudes and therefore to a high sensitivity to malfunction. That configuration does not provide for a sensor and switching function.

It is accordingly an object of the invention to provide a sensor circuit configuration, which overcomes the hereinafore-mentioned disadvantages of the heretofore-known devices of this general type, and which as a sensor circuit ascertains the type of external wiring and enables a defined switchover between two signal sources in such a way that at high frequencies, comparatively low currents and low losses are possible.

With the foregoing and other objects in view there is provided, in accordance with the invention, a sensor circuit configuration, comprising a digital signal source, a further signal source having a function-determining element, a controllable current source configuration having an output, a control terminal selectively connecting the controllable current source configuration to the digital signal source and to the function-determining element, and a multiplexer having an address input controlled by the output of the controllable current source configuration and data inputs connected to the signal sources.

An advantage of the sensor circuit configuration according to the invention is that the sensor portion ascertains the type of external wiring, either with a digital signal source or a function-determining element of the further signal source, and only switches through the output of one signal source as a function thereof. A further advantage of the invention is that the currents for the further signal source can remain low up to high frequencies, without impairing the functional reliability. Another advantage of the invention is that any time constants that might be necessary can be accomplished with the aid of an integration capacitor.

In accordance with another feature of the invention, the controllable current source configuration includes a fixed current source and a controllable current source operating counter to the fixed current source, the controllable current source having a current mirror and two complementary control transistors being connected in series with the current mirror and being connected to the control terminal.

In accordance with a further feature of the invention, the current mirror has an input branch and an output branch, and each of the control transistors is connected in series with a respective on of the branches.

In accordance with an added feature of the invention, there is provided an integration capacitor connected to the output of the controllable current source configuration.

In accordance with an additional feature of the invention, there is provided an amplifier or Schmitt trigger connected to the output side of the controllable current source configuration, the amplifier or Schmitt trigger having transistors with a geometry providing the integration capacitor.

In accordance with yet another feature of the invention, there is provided a reference terminal, and a potential control element connected between the control terminal and the reference terminal.

In accordance with yet a further feature of the invention, there is provided a supply voltage terminal, the function-determining element of the further signal source being a resistor connected to the supply voltage terminal, and the control terminal being connected to the further signal source and to the resistor.

In accordance with yet an added feature of the invention, the further signal source has a shutoff input, and the output of the controllable current source configuration is connected to the shutoff input.

In accordance with yet a concomitant feature of the invention, there are provided transistors having a geometry substantially determining threshold voltages or time constants of the configuration.

Finally, an advantage of the invention is that upon the connection of one digital signal source, the further signal source can be switched off completely, so that losses can be kept relatively slight.

Other features which are considered as characteristic for the invention are set forth in the appended claims.

Although the invention is illustrated and described herein as embodied in a sensor circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a schematic circuit diagram of a sensor circuit configuration according to the invention, having the following selective wiring alternatives:

(a) digital signal source; and (b) further signal source.

Referring now to the single figure of the drawing in detail, there is seen a sensor portion of a sensor circuit configuration according to the invention, which is formed of a current source controllable through a control terminal SE. The current source operates counter to a fixed current source. The controllable current source is formed of a current mirror having transistors MP1 and MP2, of which the transistor MP1 is connected as a diode. Furthermore, control transistors MN2 and MP3 are each connected in series with a respective one of the two current source transistors MP1 and MP2 and have a common gate connection which is connected to the control terminal SE. The transistors MN2 and MP3 are complementary to one another in terms of their conduction types. It is also possible for the output circuits the transistors MN2 and MP3 to be connected in series and to be in series with one of the two current source transistors MP1 and MP2.

A fixed current source being formed of transistors MN3–MN5 operates counter to the aforementioned controllable current source. The transistors MN3 and MN5 form a current mirror, in which the transistor MN5 is connected as a diode. The transistor MN4 is likewise connected as a diode or load element. The output circuit of the transistor MN3 is in series with the output circuit of the transistor MP3, and a connection point between the output circuits represents the output of the sensor part of the circuit. The transistors MN3-MN5 of the fixed current source are n-conducting in the exemplary embodiment, while the transistors MP1 and MP2 of the current source that are controllable through the control transistors MN2 and MP3 are p-conducting. The controllable current source and the fixed current source are complementary current sources and form a controllable current source configuration, which is supplied by a supply voltage source with a voltage present between terminals VSS and VDD. The control terminal SE is also connected through a potential control element to the terminal VDD of the circuit which is at ground potential. In the exemplary embodiment, the potential control element is formed by a transistor MN1 which is connected as a diode. Additionally, the terminal SE leads to one data input of a multiplexer MUX and to one control input of a further signal.

A digital signal source DSQ and one terminal of a resistor RSQ are selectively connectable to the control terminal SE, as respective alternatives a and b mentioned above. The other terminal of the resistor RSQ is connected to the supply terminal VSS.

The output side of the controllable current source configuration is followed by a first inverter formed of transistors MP4 and MN6. The transistors of the first inverter are complementary MOS transistors. A second inverter I is connected to the output side of the first inverter. The output side of the second inverter I on one hand controls the address input of the multiplexer MUX and on the other hand controls one input of the further signal source SQ. The output SA of the multiplexer MUX forms the output of the sensor circuit configuration. The multiplexer may be in the form of an analog or digital multiplexer depending on the intended use. In the exemplary embodiment, it is symbolically represented by two controlled transfer switches. The inverter I is often advantageous, but not absolutely necessary. The inverter I is dispensed with particularly when a Schmitt trigger is used.

The function of the sensor circuit configuration according to the invention will be described below.

The sensor portion of the circuit determines whether a digital signal source is or is not connected to the control terminal SE. The precondition is that the digital signal source furnishes well-defined logic levels, and the edge steepness is sufficient. The sensor part of the circuit is constructed in accordance with the invention in such a way that the sensor criterion is the voltage value at the control terminal SE. The sensor part of the circuit functions in a high-resistance manner, so that the elements connected to the control terminal SE are not heavily loaded.

In alternative a, the digital signal source DSQ is connected to the control terminal SE. An input branch of the controllable current source which is formed of the transistors MP1 and MN2, only permits current to flow when the input voltage at the control terminal SE is above a predetermined value. The magnitude of the current can be varied by means of the geometry of the control transistor MN2. With an increasing gate control voltage, the current through the input branch becomes increasingly great. Since the transistors MP1 and MP2 form a current mirror, the current in the input branch also flows in the output branch of the controllable current source, but only on the condition that the control transistor MP3 does not switch off. However, the transistor MP3 is complementary in type to the transistor MN2 and switches off only when its gate potential becomes too high. Below this threshold voltage, the transistor MP3 provides a current source or resistor. Accordingly, one of the two control transistors MN2 or MP3 always block with well-defined logic levels of the digital signal source DSQ. Therefore, in that operating state, the controllable current source does not furnish any current.

On the other hand, the fixed current source formed of the transistors MN3–MN5 furnishes current continuously. Since the two partial current sources operate counter to one another, the partial currents of the partial current sources are added together at the output of the controllable current source configuration. Depending on which partial current source is more productive, the output of the controllable current source configuration is at high or low potential. In alternative a, the output is at low potential, so that with the interpolation of the two inverter amplifiers being formed of the elements MP4 and MN6 or I, the control input of the multiplexer MUX is likewise at low potential. This switching state should thus have the same significance as switching through the data input "0" to the output SA of the multiplexer. In other words, in that case the digital signal source DSQ is switched through on the output side, through the control terminal SE and the multiplexer MUX, directly to the terminal SA. According to an advantageous embodiment of the invention, the output of the inverter I is likewise applied to a control input of the further signal source SQ, which causes a low potential to switch off the further current source SQ. On the other hand, the further signal source SQ is put into operation by a high potential.

In alternative b, the control terminal SE is connected to the resistor RSQ. A current then flows through the resistor RSQ and the potential control element MN1, so that a direct voltage potential is established at the control terminal SE. Parasitic capacitances have little or no influence on the direct voltage potential at the control terminal SE. However, they do advantageously improve the performance of the circuit configuration, because they have the effect of further smoothing the potential applied to the terminal SE.

Since a medium potential located between the two logic levels is established because of the wiring with the resistor RSQ at the terminal SE, the two control transistors MN2 and MP3 become conducting. The current which is then able to be furnished by the controllable current source will be low at a control potential in the vicinity of one of the two logic thresholds, and comparably high at a medium potential. The controllable current source and the fixed current source, including the control transistors and the potential control element, are dimensioned in such a way that the potential at the output of the controllable current source configuration is defined by the input level at the control terminal SE. In accordance with the invention, this means that when a resistor RSQ is connected, the output of the current source configuration is at high potential. As a result, the output of the inverter I is also at high potential, so that on one hand the further signal source SQ can be switched on and on the other hand the control input of the multiplexer MUX is at high potential, so that the address "1", that is the output of the further signal source SQ, is switched through to the output terminal SA of the multiplexer. It can also be noted that the inverting amplifier formed by the elements MP4 and MN6 may be constructed as a Schmitt trigger.

The resistor RSQ not only performs the function of switching on the further signal source SQ and of controlling the address input of the multiplexer MUX, but it also performs a function as a frequency-determining element for the further signal source SQ. For instance, this may occur due to the potential control element MN1 forming a current mirror along with further elements in the further signal source, and the frequency being varied as a function of the current flowing through the resistor RSQ. The further signal source SQ thus forms a voltage-controlled oscillator (VCO). However, with the connection of the digital signal source DSQ to the control terminal SE according to alternative a, the digital signal source is loaded by the current flowing through the potential control element. Overall, however, the losses resulting from the sensor circuit configuration according to the invention can be kept comparatively low.

The previous precondition was that the digital signal source DSQ to be selectively connected to the control terminal SE had a sufficient edge steepness upon a change in logic levels. "Sufficient" in this connection means that the potential change between the logic levels takes place faster than would correspond to the internally predetermined time constants, so that the sensor circuit configuration does not switch over, or the control transistors MN2 and MP3 block the controllable current source permanently.

However, if the internal time constants are too low, or the edge steepness of the digital signal source is no longer sufficient, then a potential is briefly present at the control input SE that leads to a current conduction of the controllable current source at the change in level between the logic signal levels. According to an advantageous feature of the invention, these brief disruptions are suppressed by means of an integration element. To this end, an integration capacitor is connected to the output of the controllable current source configuration, at a connection point between the output circuits of the transistors MN3 and MP3. According to an advantageous embodiment, the capacitor is not provided as a discrete component, but it is instead provided by the geometry of the transistors MP4 and MN6 of the inverter-amplifier, or optionally of a Schmitt trigger. To this end, the ratio of the channel width to the channel length of the transistors, or the gate areas, are selected in such a way as to be comparatively large. In this way, the threshold voltage of the amplifier becomes adjustable. A general guideline may be that the channel width is approximately 2 to 4 times, and the channel length is approximately 4 to 12 times, as large as in the other transistors of the current source configuration. In this way both the threshold voltages of the transistors and the time constants can be adjusted independent of one another within predetermined limits through the dimensioning of the transistor geometry of the sensor circuit configuration according to the invention.

The foregoing is a description corresponding in substance to European Application No. 88 116 231.7, dated Sept. 30, 1988, the International priority of which is being claimed for the instant application, and which is hereby made part of this application. Any material discrepancies between the foregoing specification and the aforementioned corresponding European application are to be resolved in favor of the latter.

I claim:

1. Sensor circuit configuration, comprising a digital signal source, a further signal source having a function-determining element, a controllable current source configuration having an output, a control terminal selectively connecting said controllable current source configuration to said digital signal source and to said function-determining element, and a multiplexer having an address input controlled by said output of said controllable current source configuration and data inputs connected to said signal sources.

2. Configuration according to claim 1, wherein said controllable current source configuration includes a fixed current source and a controllable current source operating counter to said fixed current source, said controllable current source having a current mirror and two complementary control transistors being connected in series with said current mirror and being connected to said control terminal.

3. Configuration according to claim 2, wherein said current mirror has an input branch and an output branch, and each of said control transistors is connected in series with a respective one of said branches.

4. Configuration according to claim 1, including an integration capacitor connected to said output of said controllable current source configuration.

5. Configuration according to claim 4, including an amplifier connected to said output side of said controllable current source configuration, said amplifier having transistors with a geometry providing said integration capacitor.

6. Configuration according to claim 4, including a Schmitt trigger connected to said output side of said controllable current source configuration, said Schmitt trigger having transistors with a geometry providing said integration capacitor.

7. Configuration according to claim 1, including a reference terminal, and a potential control element connected between said control terminal and said reference terminal.

8. Configuration according to claim 7, including a supply voltage terminal, said function-determining element of said further signal source being a resistor connected to said supply voltage terminal, and said control terminal being connected to said further signal source and to said resistor.

9. Configuration according to claim 1, wherein said further signal source has a shutoff input, and said output of said controllable current source configuration is connected to said shutoff input.

10. Configuration according to claim 1, including transistors having a geometry substantially determining threshold voltages of the configuration.

11. Configuration according to claim 1, including transistors having a geometry substantially determining time constants of the configuration.

* * * * *